(12) United States Patent
Ding et al.

(10) Patent No.: US 8,847,686 B2
(45) Date of Patent: Sep. 30, 2014

(54) ELECTRONIC SYSTEM, RF POWER AMPLIFIER AND TEMPERATURE COMPENSATION METHOD THEREOF

(71) Applicants: Universal Scientific Industrial ( Shanghai ) Co., Ltd., Shanghai (CN); Universal Global Scientific Industrial Co., Ltd., Nantou County (TW)

(72) Inventors: Jaw-Ming Ding, Taoyuan County (TW); Sung-Mao Li, Kinmen County (TW); Wei-Hsuan Lee, New Taipei (TW)

(73) Assignees: Universal Scientific Industrial (Shanghai) Co., Ltd., Shanghai (CN); Universal Global Scientific Industrial Co., Ltd., Nantou County (TW)

( * ) Notice: Subject to any disclaimer, the term of this patent is extended or adjusted under 35 U.S.C. 154(b) by 91 days.

(21) Appl. No.: 13/791,844

(22) Filed: Mar. 8, 2013

(65) Prior Publication Data
US 2014/0132350 A1    May 15, 2014

(30) Foreign Application Priority Data

Nov. 14, 2012   (TW) .............................. 101142367 A

(51) Int. Cl.
*H03F 3/04*        (2006.01)
*H03G 1/00*        (2006.01)
(52) U.S. Cl.
CPC ................................... *H03G 1/0017* (2013.01)
USPC ......................................... 330/289; 330/296

(58) Field of Classification Search
CPC .................................... H03F 3/04; H03G 3/10
USPC ............................... 330/289, 296, 285, 207 P
See application file for complete search history.

(56) References Cited

U.S. PATENT DOCUMENTS

| | | | | |
|---|---|---|---|---|
| 5,724,004 A | * | 3/1998 | Reif et al. ...................... | 330/277 |
| 7,400,202 B2 | * | 7/2008 | Yamamoto et al. ........... | 330/296 |
| 8,624,675 B2 | * | 1/2014 | Lautzenhiser ................ | 330/285 |
| 8,692,619 B2 | * | 4/2014 | Wakita et al. ................. | 330/296 |

* cited by examiner

*Primary Examiner* — Henry Choe
(74) *Attorney, Agent, or Firm* — Li & Cai Intellectual Property (USA) Office

(57) ABSTRACT

A radio frequency (RF) power amplifier is disclosed. The RF radio power amplifier includes a bias current generating unit, a first impedance unit, a second impedance unit, a third impedance unit and an output stage unit. The bias current generating unit receives a reference voltage. There is a first voltage with negative temperature coefficient between the first impedance unit and the second impedance unit, and the second unit receives a ground current. There is a second voltage between the third impedance unit and the second impedance unit, and the second voltage is a partial voltage of the first voltage. The bias current generating unit outputs a bias current with positive temperature coefficient according to the second voltage. The output stage unit receives an input current. The bias current is a sum of the input current with positive temperature coefficient and the ground current.

7 Claims, 6 Drawing Sheets

400

ELECTRONIC SYSTEM, RF POWER AMPLIFIER AND TEMPERATURE COMPENSATION METHOD THEREOF

BACKGROUND OF THE DISCLOSURE

1. Field of the Disclosure

The instant disclosure relates to a radio frequency (RF) power amplifier; in particular, to a RF power amplifier with temperature compensation.

2. Description of Related Art

Among hand-held wireless communication products, main direct current (DC) power consumption comes from a RF power amplifier. Therefore, to keep a high linearity of the RF power amplifier instead of distorting an amplified signal, and to maintain a high efficiency to support a long time of communication has always been a focus in designing the RF power amplifier. In particular, there is an obvious characteristic of a time-varying wave packet when a broadly used digital modulation technique of orthogonal frequency-division multiplexing (OFDM) is adopted in a wireless communication system, and a constant of peak to average power ratio (PAPR) of which is way higher than that of the current wireless communication system; in other words, the variation of the wave packet with time is more dramatic, and thus a demand of the linearity of the RF power amplifier is higher.

Referring to FIG. 1, the RF power amplifier 100 in prior arts includes a transistor Q1, resistors R1' and R2', and a transistor Q2, wherein the transistor Q1 is a depletion-type field effect transistor (FET), and the transistor Q2 is a bipolar junction transistor (BJT). A drain of the transistor Q1 receives a reference voltage VREF'; a terminal of the resistor R1' is coupled to a source of the transistor Q1; another terminal of the resistor R1' is coupled to a gate of the transistor Q1; a terminal of the resistor R2' is coupled to another terminal of the resistor R1'; another terminal of the resistor R2' is coupled to a base of the transistor Q2; an emitter of the transistor Q2 is coupled to a ground voltage GND, a collector of the transistor Q2 is coupled to a system voltage VCC'.

In the RF power amplifier 100 in the prior arts, the transistor Q1 outputs a current ID' with a fixed value, and the current ID' is equal to an input current IB' (base current) of the transistor Q2. Since a current gain (B) of the transistor Q2 is with a negative temperature coefficient, and the current ID' is a current with a close-to-zero temperature coefficient, an output current IC' of the transistor Q2 is a current with a negative temperature coefficient and varies with a change of a surrounding temperature.

Referring to FIGS. 2A-2C, FIGS. 2A-2C are simulation waveforms corresponding to FIG. 1, wherein an abscissa in every drawings represents a temperature, and a range of the temperature is set from −40☐ to +90☐. In the FIG. 2A, an ordinate represents the current ID', and the current ID' as shown in FIG. 2A varies with the change of the surrounding temperature, and a value of the bias current ID' is substantially equal to the fixed value. In FIG. 2B, an ordinate represents a current gain, and a value of the current gain decreases with an increasing temperature. In FIG. 2C, an ordinate represents the output current IC', and the output current IC' decreases with an increasing temperature, and further greatly affects an output power of the RF power amplifier 100 in the prior arts, which may fail to achieve a demand of the RF power amplifier operated in a high/low surrounding temperature in a current communication system.

SUMMARY OF THE DISCLOSURE

The instant disclosure provides a RF power amplifier, and the RF radio power amplifier includes a bias current generating unit, a first impedance unit, a second impedance unit, a third impedance unit and an output stage unit. The bias current generating unit receives a reference voltage. The second impedance unit is electrically connected to the first impedance unit, and there is a first voltage with a negative temperature coefficient between the first impedance unit and the second impedance unit, and the second unit receives a ground current. The third impedance unit is electrically connected to the second impedance unit, and there is a second voltage between the third impedance unit and the second impedance unit, and the second voltage is a partial voltage of the first voltage, wherein the bias current generating unit is electrically connected between the second impedance unit and the third impedance unit, and the bias current generating unit outputs a bias current with a positive temperature coefficient according to the second voltage. The output stage unit is electrically connected between the first impedance unit and the second impedance unit, and the output stage unit receives an input current. The bias current is a sum of the input current and the ground current, and the input current has a characteristic of a positive temperature coefficient; when a ratio constant of the output current to the input current of the output stage unit is with a negative temperature coefficient, a temperature coefficient of the output current is substantially equal to a zero temperature coefficient.

An embodiment of the present disclosure provides an electronic system for a radio frequency communication, and the electronic system includes a RF power amplifier and a load, stabilizing an output power. The RF power amplifier receives a RF input signal and outputs a RF output signal. The load is electrically connected to the RF power amplifier, receiving the RF output signal, wherein a bias current generating unit outputs a bias current with a positive temperature coefficient according to a second voltage.

An embodiment of the present disclosure provides a temperature compensation method, and the temperature compensation method includes steps as follows: taking a base-emitter voltage with a negative temperature coefficient as a first voltage in a bias circuit; having a second voltage feedback to a bias current generating unit, wherein the second voltage is a partial voltage of the first voltage; generating an input current with a positive temperature coefficient; when a ratio constant of the output current to the input current of the output stage unit is with a negative temperature coefficient, a temperature coefficient of the output current is substantially equal to a zero temperature coefficient.

To sum up, the electronic system, the RF power amplifier and the temperature compensation method provided by the embodiments of the instant disclosure are able to stabilize the output power and the output current of the RF power amplifier and further achieve a high linearity of the RF power amplifier.

For further understanding of the instant disclosure, reference is made to the following detailed description illustrating the embodiments and examples of the instant disclosure. The description is only for illustrating the present disclosure, not for limiting the scope of the claim.

BRIEF DESCRIPTION OF THE DRAWINGS

To be easily understood, embodiments of the instant disclosure refer to accompanying drawings, and in the drawings.

DETAILED DESCRIPTION OF PREFERRED EMBODIMENTS

Figure 1:
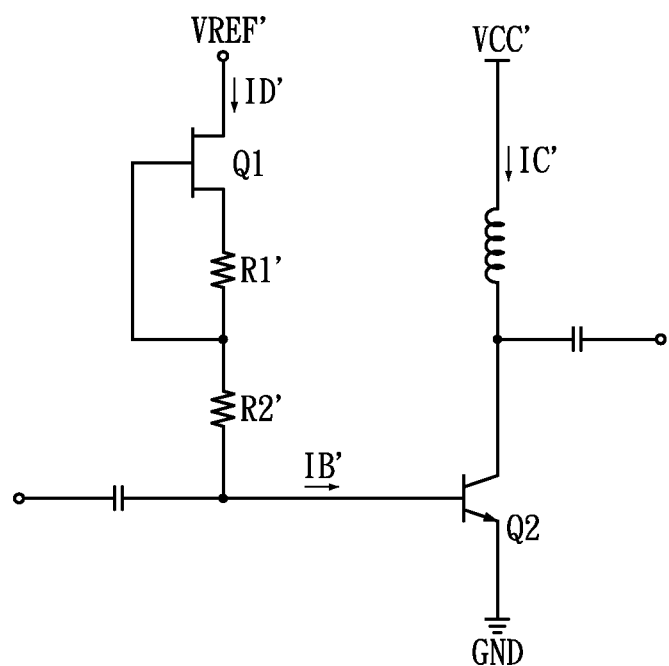
FIG. 1 shows a detailed circuit diagram of a RF power amplifier in prior arts.
Figure 2A:
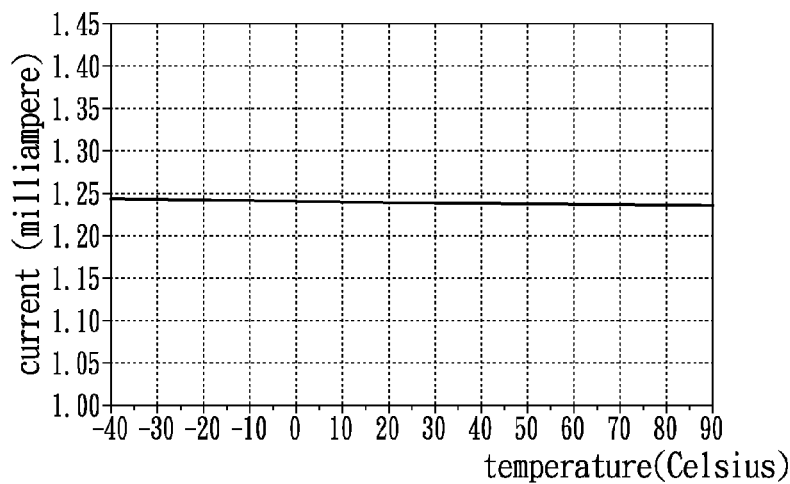
FIGS. 2A-2C show simulation waveforms corresponding to FIG. 1.
Figure 2B:
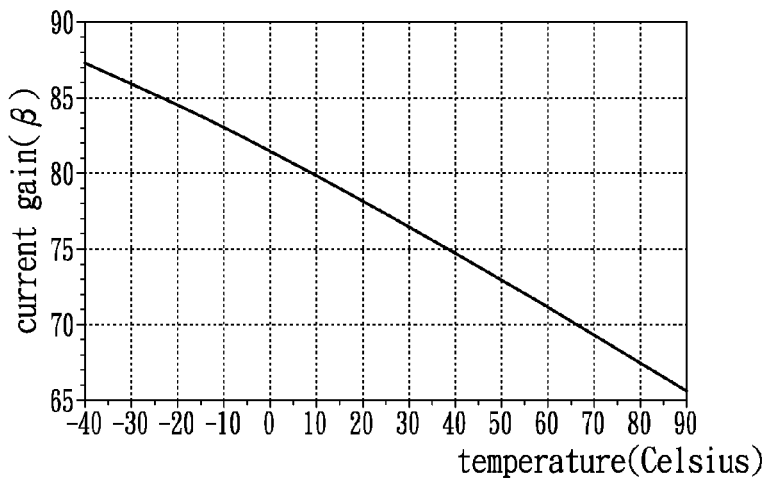
Figure 2C:
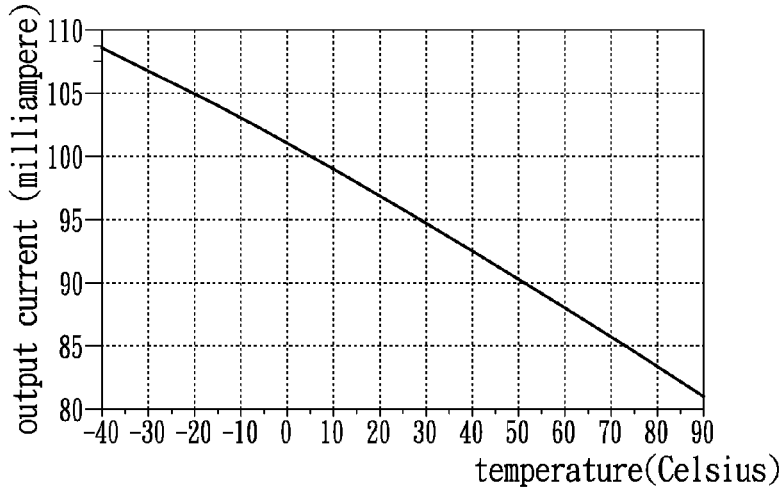

The aforementioned illustrations and following detailed descriptions are exemplary for the purpose of further explaining the scope of the instant disclosure. Other objectives and advantages related to the instant disclosure will be illustrated in the subsequent descriptions and appended drawings. In the drawings, the size and relative sizes of layers and regions may be exaggerated for clarity.

Figure 3:
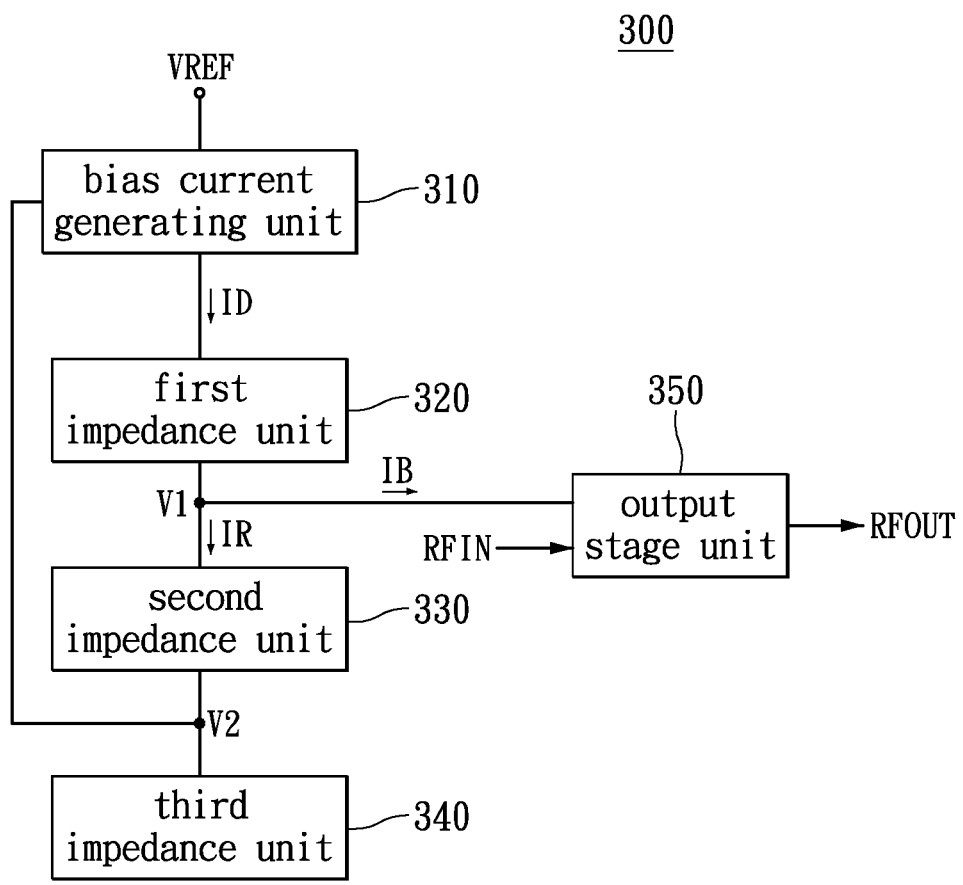
FIG. 3 shows a block diagram of a RF power amplifier according to an embodiment of the instant disclosure.

Referring to FIG. 3, FIG. 3 shows a block diagram of a RF power amplifier 300 according to an embodiment of the instant disclosure. The RF power amplifier 300 includes a bias current generating unit 310, a first impedance unit 320, a second impedance unit 330, a third impedance unit 340 and an output stage unit 350.

The first impedance unit 320 is electrically connected to the bias current generating unit 310. The second impedance unit 330 is electrically connected to the first impedance unit 320. The third impedance unit 340 is electrically connected to the second impedance unit 330, and the bias current generating unit 310 is electrically connected between the second impedance unit 330 and the third impedance unit 340. The output stage unit 350 is electrically connected between the first impedance unit 320 and the second impedance unit 330.

The RF power amplifier 300 is used for amplifying a RF input signal RFIN, wherein the bias current generating unit 310 receives a reference voltage VREF and generates a bias current ID, and the reference voltage VREF is generally stably provided from a DC-DC converter or a General Purpose Input/Output, GPIO of a Transceiver IC. There is a first voltage V1 with a negative temperature coefficient between the second impedance unit 330 and the first impedance unit 320, the first voltage V1 is provided by the output stage unit 350, and the second impedance unit 330 receives a ground current IR. There is a second voltage V2 between the third impedance unit 340 and the second impedance unit 330, and the second voltage V2 is a partial voltage of the first voltage V1, and thus the second voltage V2 has a characteristic of the negative temperature coefficient. The output stage unit 350 receives an input current IB. The bias current generating unit 310 outputs the bias current ID with a positive temperature coefficient according to the second voltage V2, wherein the bias current ID is equal to a sum of the ground current IR and the input current IB, and thus the input current IB is a current with the positive temperature coefficient. When a ratio constant of the output current to the input current IB of the output stage unit 350 is a negative temperature coefficient, a temperature coefficient of the output current is substantially equal to a zero temperature coefficient. The RF power amplifier 300 of the instant disclosure is able to stabilize the output current and an output power of the output stage unit 350, and further maintains a high linearity of the RF power amplifier 300.

In the instant disclosure, the positive temperature coefficient indicates that there is a proportional relationship between physical quantities (such as a voltage value, a current value, and a resistor value) and the temperature; which means, when the temperature increases or decreases, the physical quantities increases or decreases with the temperature; the negative temperature coefficient indicates that there is an inverse relationship between the physical quantities and the temperature; which means, when the temperature increases or decreases, the physical quantities decreases or increases with the temperature. The zero temperature coefficient in the instant disclosure indicates that the relationship between the physical quantities (such as the voltage value, the current value, and the resistor value) and the temperature is irrelevant, which means, when the temperature increases or decreases, the physical quantities do not increase or decrease with the temperature.

There is further teaching about the detailed operation of the RF power amplifier as recited below.

Continuously referring to FIG. 3, in the instant disclosure, the first voltage V1 with the negative temperature coefficient inside the output stage unit 350 is electrically connected between the first impedance unit 320 and the second impedance unit 330 mainly in a way similar to a feedback, and since the second voltage V2 is a partial voltage of the first voltage V1, the second voltage V2 also has a characteristic of the negative temperature coefficient. Afterwards, in the instant disclosure, the characteristic of the temperature coefficient of the bias current ID outputted from the bias current generating unit 310 is changed to have the characteristic of a positive temperature coefficient with a feedback of the second voltage V2 to the bias current generating unit 310. The bias current generating unit 310 determines a value of the bias current ID according to the reference voltage VREF received and the second voltage V2. In the present embodiment, the bias current ID is equal to the sum of the ground current IR and the input current IB, and thus the input current IB and the ground current IR also have the characteristic of the positive temperature coefficient. When the ratio constant of the output current to the input current IB of the output stage unit 350 has a characteristic of a negative temperature coefficient, the temperature coefficient of the output current is substantially equal to a zero temperature coefficient.

Furthermore, in one embodiment, the output stage unit 350 is a bipolar junction transistor (BJT). A base of the BJT receives the input current IB and a RF input signal RFIN, a collector of the BJT is coupled to a system voltage, and outputs an output current and a RF output signal RFOUT, an emitter of the BJT is coupled to a ground voltage, wherein a ratio constant of the output current to an input current IB of the BJT is B with a negative temperature coefficient; which represents a current gain. A base-emitter voltage of the BJT is a voltage with the negative temperature coefficient; in the present embodiment, the base-emitter voltage is as a first voltage V1. Therefore, according to the descriptions disclosed above, a designer is also able to adjust a base current of the BJT to be as a current with a positive temperature coefficient; that is to adjust the input current IB of the BJT to be as a current with the positive temperature coefficient, and the output current of the BJT will further be adjusted as a current with a close to zero temperature coefficient.

Accordingly, the RF power amplifier 300 is able to provide an effective temperature compensation which stabilizes the output power and the output current of the RF power amplifier 300 with a temperature variation, and further achieves a high linearity so that an amplified signal is not distorted.

In the following embodiment, only parts that are different from parts of the embodiment in the FIG. 3 described, and the identical parts are omitted. In addition, for an easy instruction, similar referred numbers or symbols indicates elements alike.

Figure 4:
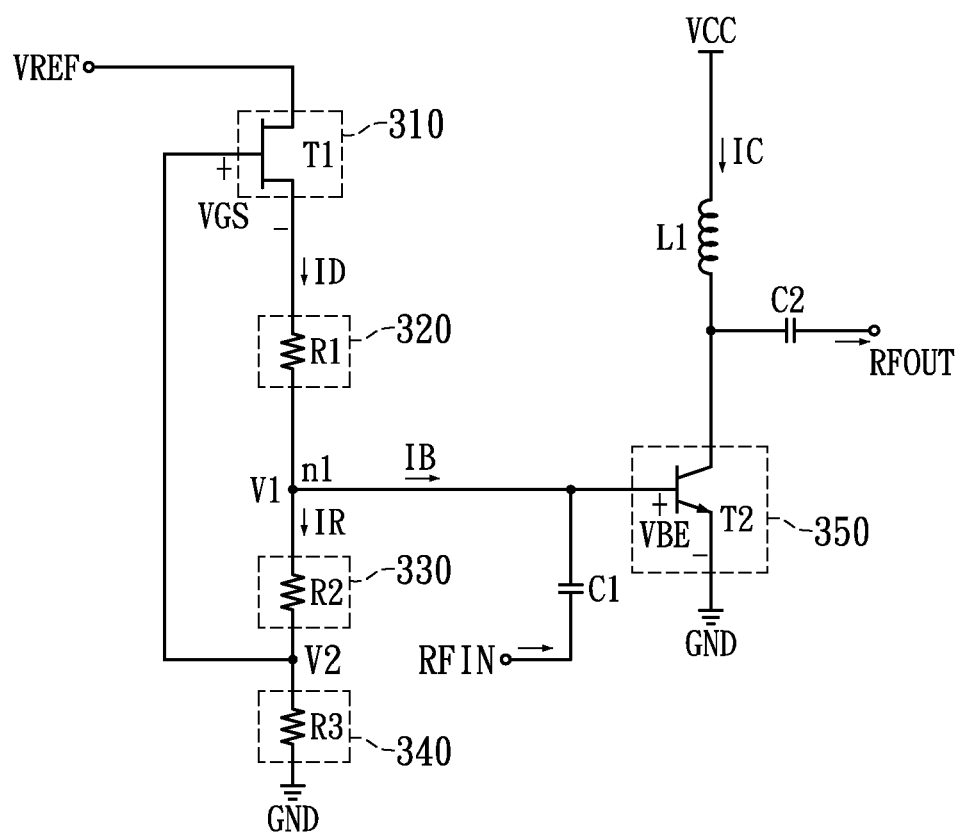
FIG. 4 shows a detailed circuit diagram of a RF power amplifier according to an embodiment of the instant disclosure.

Referring to FIG. 4, FIG. 4 shows a detailed circuit diagram of a RF power amplifier 400 according to an embodiment of the instant disclosure. In the present embodiment, a bias current generating unit 310 includes a first transistor T1. A first impedance unit 320 includes a first resistor R1. A second impedance unit 330 includes a second resistor R2. A third impedance unit 340 includes a third resistor R3. An output stage unit 350 includes a second transistor T2.

A drain of the first transistor T1 is coupled to a reference voltage VREF, and a source outputs a bias current ID, wherein a gate of the first transistor T1 is coupled between the second resistor R2 and the third resistor R3 and receives a second voltage V2. A terminal of the first resistor R1 is coupled to a source of the first transistor T1. A terminal of the second resistor R2 is coupled to another terminal of the first resistor R1. A terminal of the third resistor R3 is coupled to another terminal of the second resistor R2, and another terminal of the third resistor R3 is coupled to a ground voltage GND. A base of the second transistor T2 is coupled between the first resistor R1 and the second resistor R2, an emitter of the transistor T2 is coupled to the ground voltage GND, and a collector of the second transistor T2 is coupled to a system voltage VCC.

In the present embodiment, the first transistor T1 outputs a bias current ID with a positive temperature coefficient according to the second voltage V2, wherein the first transistor T1 is a depletion-type transistor and the first transistor T1 biases at a saturation region. A value of the bias current is determined according to the reference voltage VREF and the second voltage V2, and is able to be adjusted through a resistor value of the first resistor R1. There is a first voltage V1 with a negative temperature coefficient between the second resistor R2 and the first resistor R1, and the first voltage V1 is a base-emitter voltage VBE of the second transistor T2. There is a second voltage V2 between the third resistor R3 and the second resistor R2, and the second voltage V2 is a partial voltage of the first voltage, and thus the second voltage V2 also has a characteristic of the negative temperature coefficient. Through adjusting the resistor values of the second resistor R2 and the third resistor R3, the first transistor T1 outputs the bias current ID with a positive temperature coefficient. The second transistor T2 compensates an output current IC of the second transistor T2 with an input current IB with the positive temperature coefficient.

There is further detailed operation of the RF power amplifier 400. Continuously referring to FIG. 4, a bias circuit of the RF power amplifier 400 is a very important factor in determining a characteristic of the RF power amplifier 400. Particularly, there is a demand of a high linearity of the RF power amplifier 400 in devices such as digital mobile phones, and thus to maintain the high linearity of the RF power amplifier 400 becomes extremely important. In the present embodiment, the so called bias circuit is consisted of the first transistor T1, the first resistor R1, the second resistor R2, and the third resistor R3, and thereby provides the input current IB to the second transistor T2. The first transistor T1 of the depletion-type biases at the saturation region, and outputs a bias current ID to the first resistor R1. At a node n1, the bias current ID is equal to a sum of a ground current IR and an input current IB, in an embodiment, resistor values of the second resistor R2 and the third resistor R3 are rated as kilo-ohm (KΩ), but the resistor value of the first resistor R1 is rated as ohm (Ω). Therefore, the bias current ID is substantially almost equal to the input current IB. In addition, the first voltage V1 at the node n1 is the base-emitter voltage VBE of the second transistor, and thus the first voltage V1 has a characteristic of a negative temperature coefficient. Furthermore, since the second voltage V2 is the partial voltage of the first voltage V1, the second voltage V2 also has the characteristic of the negative temperature coefficient.

In the present embodiment, the second voltage V2 with the negative temperature coefficient is coupled to the gate of the first transistor T1 through the feedback, and thus a gate voltage of the first transistor T1 is shown as equation (1), wherein VG represents the gate voltage of the first transistor T1.

$$VG=[R3/(R2+R3)]\times VBE \qquad (1)$$

Furthermore, when a source voltage of the first transistor T1 is a sum of the first voltage V1 and the bias current ID multiplied by the value of the first resistor R1, as shown in equation (2), wherein VS represents the source voltage of the first transistor T1.

$$VS = V1 + (ID \times R1) \qquad (2)$$
$$\phantom{VS} = VBE + (ID \times R1)$$

Thus, according to equations (1) and (2), a gate-source voltage VGS of the first transistor T1 is shown as equation (3); and equation (3) may be adjusted to result in a math relation of the bias current as shown in equation (4). According to equation (4), it is assumed that the gate-source voltage VGS gets close to a fixed value with a different temperature variation, and through adjusting the resistor values of the second resistor R2 and the third resistor R3, the bias current ID is able to become a current with a characteristic of a positive temperature coefficient. Furthermore, in the present embodiment, since the resistor values of the second resistor R2 and the third resistor R3 is more than the resistor value of the first resistor R1 for about 1~2 magnitude order, and thus the bias current ID will be substantially equal to the input current IB, and the output current IB will also be a current with a positive temperature coefficient. In addition, in the present embodiment, a designer is able to adjust the value of the bias current ID through adjusting the resistor value of the first resistor R1 according to a circuit designing demand or an actual application demand.

$$VGS=-[(ID\times R1)+VBE\times(R2/(R2+R3))] \qquad (3)$$

$$ID=[|VGS|-VBE\times(R2/(R2+R3))]/R1 \qquad (4)$$

Moreover, since the second transistor T2 is a bipolar junction transistor (BJT), a math relation of the output current IC to the input current IB of the second transistor T2 is as shown in equation (5), wherein B is a current gain, having a characteristic of a negative temperature coefficient. The current gain of the second transistor T2 (i.e. the output current IC divided by the input current IB) is with a negative temperature coefficient; therefore, to have the output current IC be a current with a close to zero temperature coefficient, according to equation (4), it is to adjust the resistor values of the second resistor R2 and the third resistor R3 so that the input current IB becomes a current with a positive temperature coefficient. It is worth noticing that an absolute value of a slope of the positive temperature coefficient of the input current IB must be close to or equal to an absolute value of a slope of the negative temperature coefficient of the current gain B so as to achieve an effective temperature compensation for the output current IC.

$$IC=\beta \times IB \qquad (5)$$

Figure 5A:
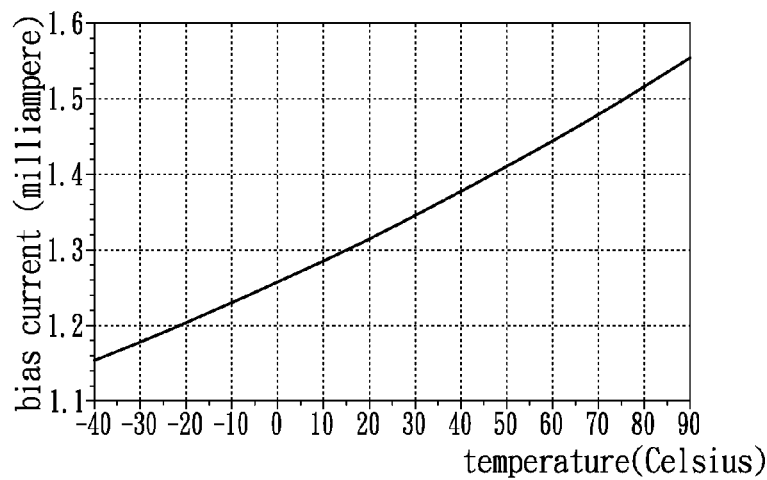
FIGS. 5A-5C show simulation waveforms corresponding to FIG. 4.
Figure 5B:
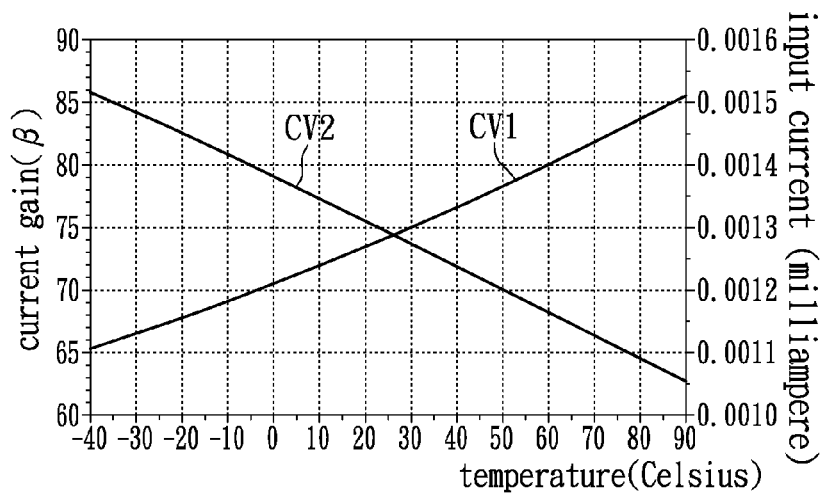
Figure 5C:
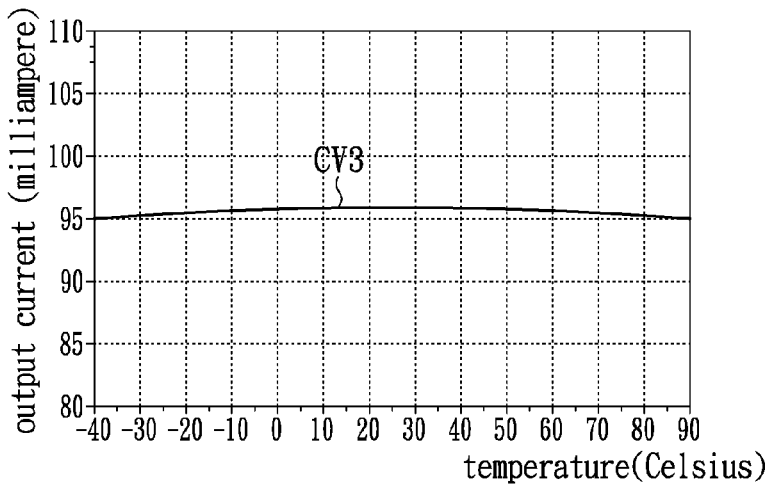

For further understanding of the instant disclosure, please refer to FIGS. 5A-5C at the same time; FIGS. 5A-5C show simulation waveforms corresponding to FIG. 4, wherein an abscissa in every drawing represents a temperature, and a range of the temperature is set from −40⸺ to +90⸺. In the FIG. 5A, an ordinate represents the bias current ID, and the bias current ID as shown in FIG. 5A varies with the change of the surrounding temperature, and a value of the bias current ID increases with an increasing temperature. In FIG. 5B, an ordinate represents a current gain (curve CV2) and input current IB (curve CV1), and the input current IB is a current after a compensation and has a characteristic of a positive temperature coefficient, and the value of the input current IB increases with an increasing temperature, but the value of the current gain decreases with the increasing temperature. It is worth noticing that the closer the absolute value of the slope of the curve CV1 gets to the absolute value of the slope of the curve CV2, the temperature compensation effect of the output current IC of the RF power amplifier 400 gets better. In FIG. 5C, an ordinate represents the output current IC (curve CV3); after the temperature compensation, the output current IC is able to achieve a characteristic close to the zero temperature coefficient; which means, with the temperature variation, the output current IC is still able to keep stable, and the RF power amplifier 400 is further able to output the stable output power, to maintain the demand of the high linearity.

As for application, the output stage unit 350 may further has a first inductor L1, a first capacitor C1 and a second capacitor C2. A terminal of the first capacitor C1 is coupled to the base of the second transistor T2, and another terminal is coupled to a RF input signal RFIN. The first inductor L1 is coupled between the system voltage VCC and a collector of the second transistor T2. A terminal of the second capacitor C2 is coupled to the collector of the second transistor T2, and another terminal outputs a RF output signal RFOUT.

When the RF power amplifier 400 has not started receiving the RF input signal RFIN yet, the first inductor L1 shows a low-impedance state, such as a short circuit, to a DC signal; on the other hand, the capacitors C1 and C2 show a high-impedance state, such as an open circuit, to the DC signal. When the RF power amplifier 300 starts receiving the RF input signal RFIN, the first inductor L1 shows the high-impedance status, such as the open circuit, to a high-frequency signal; on the other hand, the capacitors C1 and C2 show the low-impedance status, such as the short circuit, to the high-frequency signal. Accordingly, the RF power amplifier 400 is able to work well under DC or AC working modes.

Figure 6:
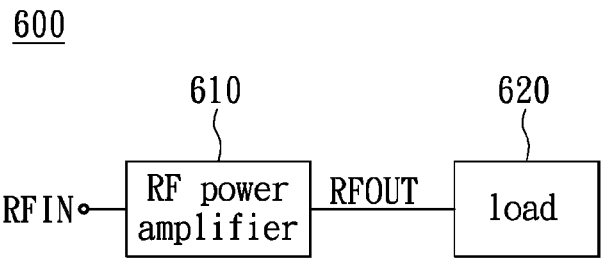
FIG. 6 shows a block diagram of an electronic system according to the embodiment of the instant disclosure.

Referring to FIG. 6, FIG. 6 shows a block diagram of an electronic system according to the embodiment of the instant disclosure. The electronic system 600 includes a RF power amplifier 610 and a load 620. The RF power amplifier 610 receives a RF input signal RFIN and outputs a RF output signal RFOUT to the load 620; which means, after the RF power amplifier 610 is coupled to a system voltage and a reference voltage, the RF power amplifier 610 provides a stable output power to the load 620. The RF power amplifier 610 may be the RF power amplifier 300 or the RF power amplifier 400 of the embodiments in FIGS. 3-4, providing the stable output power to the load. The electronic system 600 may be a system in various electronic devices such as hand-held devices or portable devices.

Figure 7:
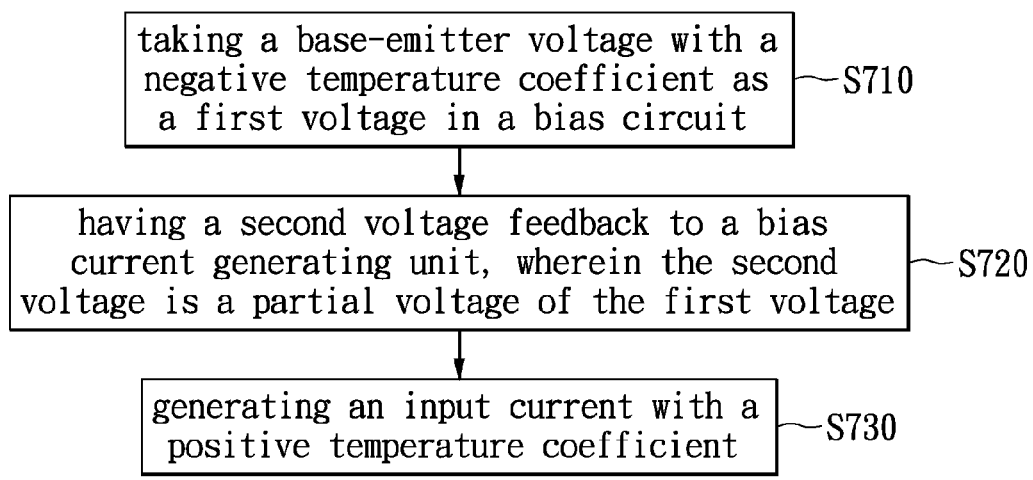
FIG. 7 shows a flow chart of a temperature compensation method according to the embodiment of the instant disclosure.

Referring to FIG. 7, FIG. 7 shows a flow chart of a temperature compensation method according to the embodiment of the instant disclosure. The method may be operated with the RF power amplifier in FIG. 3 or 4; therefore, please refer to FIG. 3 or 4 for an easy understanding. The temperature compensation method of the RF power amplifier includes steps as follows: taking a base-emitter voltage with a negative temperature coefficient as a first voltage in a bias circuit (S710); having a second voltage feedback to a bias current generating unit, wherein the second voltage is a partial voltage of the first voltage (S720); generating an input current with a positive temperature coefficient (S730). When a ratio constant of the output current to the input current of the output stage unit is a negative temperature coefficient, a temperature coefficient of the output current is substantially equal to a zero temperature coefficient.

As for the relevant details of the steps of the temperature compensation method of the RF power amplifier, there is detailed instruction in the embodiments of the FIGS. 3-4, and thus it is not repeated thereto. It is to be clarified that a sequence of the steps of the embodiment in FIG. 7 is simply for a need to easily instruct, and the sequence of the steps is not used as a limit condition in demonstrating the embodiments of the instant disclosure.

To sum up, the embodiments of the instant disclosure provide the electronic system and the RF power amplifier are able to provide an effective temperature compensation which stabilizes the output power and the output current of the RF power amplifier with a temperature variation and further achieves a high linearity so that an amplified signal is not distorted. In other words, in comparison to prior arts, the RF power amplifier of the instant disclosure has less chances of facing a problem of facing a sudden dropping linearity with a varying surrounding temperature.

In at least one of the embodiments of the instant disclosure, an absolute value of a slope of the positive temperature coefficient of the input current must be close to or equal to an absolute value of a slope of the negative temperature coefficient of the current gain B so as to achieve an effective temperature compensation of the output current and the output power.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A radio frequency (RF) power amplifier, amplifying a RF input signal, comprising:
a bias current generating unit, receiving a reference voltage;
a first impedance unit, electrically connected to the bias current generating unit;
a second impedance unit, electrically connected to the first impedance unit, wherein there is a first voltage with a negative temperature coefficient between the first impedance unit and the second impedance unit, and the second impedance unit receives a ground current;
a third impedance unit, electrically connected to the second impedance unit, wherein there is a second voltage between the third impedance unit and the second impedance unit, and the second voltage is a partial voltage of the first voltage, wherein the bias current generating unit is electrically connected between the second impedance unit and the third impedance unit, and the bias current generating unit outputs a bias current with a positive temperature coefficient according to the second voltage; and
an output stage unit, electrically connected between the first impedance unit and the second impedance unit, and the output stage unit receiving an input current;

wherein the bias current is a sum of the input current and the ground current, and the input current has a characteristic of a positive temperature coefficient, when a ratio constant of the output current to the input current of the output stage unit is a negative temperature coefficient, a temperature coefficient of the output current is substantially equal to a zero temperature coefficient.

2. The RF power amplifier according to claim 1, wherein the first voltage is provided by the output stage unit.

3. The RF power amplifier according to claim 1, wherein the bias current generating unit comprising:
a first transistor, having a drain coupled to the reference voltage, a gate receiving the second voltage, and a source outputting the bias current, and the first transistor outputs the bias current with a positive temperature coefficient according to the second voltage,
wherein the first transistor is a depletion-type transistor.

4. The RF power amplifier according to claim 3, wherein the first impedance unit comprising:
a first resistor, having a terminal coupled to a source of the first transistor, and a value of the bias current is determined according to a resistor value of the first resistor and the reference voltage.

5. The RF power amplifier according to claim 4, wherein the second impedance unit comprising:
a second resistor, having a terminal coupled to another terminal of the first resistor, wherein there is a first voltage with a negative temperature coefficient between the second resistor and the first resistor, wherein a terminal of the second resistor receives the ground current.

6. The RF power amplifier according to claim 5, wherein the third impedance unit comprising:
a third resistor, having a terminal coupled to another terminal of the second resistor, and another terminal coupled to a ground voltage, wherein there is a second voltage between the third resistor and the second resistor, and the second voltage is a partial voltage of the first voltage,
wherein a gate of the first transistor is coupled between the second resistor and the third resistor, and through adjusting the resistor values of the second resistor and the third resistor, the first transistor outputs the bias current with a positive temperature coefficient.

7. The RF power amplifier according to claim 6, wherein the output stage unit comprising:
a second transistor, having a base coupled between the first resistor and the second resistor, the second transistor receiving an input current, and an emitter coupled to the ground voltage, and a collector coupled to a system voltage, wherein a base-emitter voltage of the second transistor is the first voltage, and the second transistor compensates an output current of the second transistor with the input current with a positive temperature coefficient.

* * * * *